(12) United States Patent
Johri et al.

(10) Patent No.: US 7,711,524 B2
(45) Date of Patent: May 4, 2010

(54) ESTIMATING BOUNDARIES OF SCHMOO PLOTS

(75) Inventors: Lokesh Johri, San Jose, CA (US);
Kaushik Ghosh, San Jose, CA (US);
Ben Rogel-Favila, Santa Clara, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 1101 days.

(21) Appl. No.: 11/311,025

(22) Filed: Dec. 19, 2005

(65) Prior Publication Data
US 2007/0156352 A1   Jul. 5, 2007

(51) Int. Cl.
*G06F 15/00* (2006.01)

(52) U.S. Cl. .................................................. 702/189

(58) Field of Classification Search ................. 702/182, 702/189; 714/733, 736
See application file for complete search history.

(56) References Cited

U.S. PATENT DOCUMENTS

| 6,079,038 A * | 6/2000 | Huston et al. ................ 714/724 |
| 6,418,387 B1 * | 7/2002 | Carney ........................ 702/81 |
| 6,795,788 B2 * | 9/2004 | Thatcher et al. ............. 702/119 |

* cited by examiner

*Primary Examiner*—Bryan Bui
(74) *Attorney, Agent, or Firm*—Holland & Hart, LLP

(57) ABSTRACT

A method and system generate a boundary of a Schmoo plot. In accord with the method, a plurality of seed points having a resolution that is less than or equal to ½ the acquisition resolution indicated by a smoothness of a representative Schmoo boundary are selected. A coarse boundary search is performed to identify a plurality of test points that are within an acquisition resolution of the boundary. The test points that comprise the coarse boundary are interpolated to produce a fine estimate of the boundary.

32 Claims, 4 Drawing Sheets

US 7,711,524 B2

ESTIMATING BOUNDARIES OF SCHMOO PLOTS

BACKGROUND

A Schmoo plot, also known as a Shmoo plot, schmoo, or shmoo, is a technique that is used to characterize the results of integrated circuit testing. Measurements performed on a device under test (DUT) may be performed as one or more parameters are varied. If a first parameter P1 is tested over a first range of M values and a second parameter P2 is tested over a second range of N values, then there are M*N possible measurements that can be made. The results of testing the DUT at these M*N values of P1 and P2 may be plotted in a two-dimensional grid. The resulting plot is called a Schmoo plot, and indicates regions of successful and unsuccessful testing. Schmoo plots can have more than two dimensions, such as when a DUT is tested as three parameters are varied over a 3-D grid to produce a 3-D Schmoo plot.

Determining the Schmoo plot can become very time-consuming in a finely grained mesh since each measurement point must be computed sequentially. The time-consuming nature of Schmoo plots is problematic, and can result in failure analysis of a small number of DUTs.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
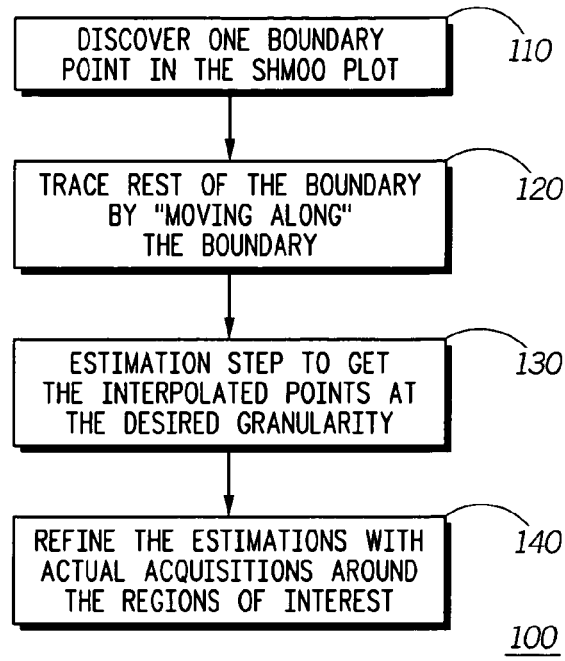
FIG. 1 is a flowchart illustrating boundary estimation, according to certain embodiments.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

The accuracy of a Schmoo plot may be described by the spacing between values of its underlying test parameters (such as temperature or voltage), and the value of a test result on a grid that divides these test parameters. Each dimension of a Schmoo plot has an associated acquisition resolution, which dictates the required spacing between the test points that make up the grid. The spacing of points along a first dimension need not be the same as the spacing of points along a second dimension, leading to rectangular Schmoo plots in 2 dimensions for example. Schmoo plots may have one or more disjoint boundary regions. It is noted that the boundary estimation technique presented herein may be applied to each of the boundaries present in a Schmoo plot in a parallel fashion.

Schmoo plots have smooth boundaries, so that the inverse of the acquisition resolution is less than a highest frequency component in the frequency domain content of a Schmoo boundary. The smoothness of a Schmoo boundary may be determined empirically. The smoothness property of Schmoo boundaries allows interpolation techniques such as FFT-based or cubic spline-based interpolation to be applied to a Schmoo plot having a reduced sampling resolution. For example, the interpolated smoothness of a Schmoo plot has been found to be substantially equivalent to the smoothness of a Schmoo plot created using a desired acquisition resolution. In certain embodiments, smooth Schmoo curves can be created using $\frac{1}{8}$ or $\frac{1}{16}^{th}$ of the acquisition resolution. Using a resolution less than the test resolution allows fewer test points to be computed while still providing accurate boundary estimation. Testing has revealed that the use of FFT-based interpolation is able to reduce the computational complexity by a factor of 256 ($16^2$) in a two-parameter Schmoo plot. Schmoo plots commonly have 32/32 or a larger number of points. It is also noted that other interpolation techniques such as linear interpolation, higher order polynomial interpolation, wavelet-based interpolation and trigonometric interpolation may be used without departing from the spirit and scope of the present invention.

A procedure for efficient discovery of the Schmoo curve may be divided into a seed stage, coarse boundary discovery stage, interpolation stage, and final refinement stage.

Seeding Stage

A number of seed points are selected over the range of the parameter values of the Schmoo plot. The seed points are used to divide a Schmoo plot into a number of disjoint regions. For example, in a binary valued result space, if a Schmoo plot has a single fail region and a minority of seed points are in the fail region then we discard those and use the seed points having a pass test value to discover the coarse boundary. Each seed point having a pass test value is then used to discover the pass/fail coarse boundary. This process is covered in more detail with reference to FIG. 2 and FIG. 4.

Coarse Boundary Discovery

The coarse boundary is computed using the previously selected seed points having a same test result value. Starting with a first seed point, a neighboring point of the first seed point is located that has the same test result value. This neighboring point is then used as the starting point for the discovery of the next boundary point. This process continues until the next discovered point is within acquisition resolution of the first seed point. In certain embodiments, this process is continued until the next discovered point is the first point. The set of points so discovered provide a coarse estimate of the boundary. This process is covered in more detail with reference to FIG. 3.

Interpolation

The coarse boundary may be further refined using interpolation techniques. FFT-based interpolation may be used when the test results have more than two possible outcomes. Spline-based interpolation, comprising fitting an N−1 order curve to N adjacent boundary points at the acquisition resolution, is useful when the coarse boundary is a pass/fail boundary. This process is covered in more detail with reference to FIG. 5 and FIG. 6. In certain embodiments the neighbors of the coarse boundary may also be interpreted.

Final Refinement

The boundary estimate may be further refined by searching the neighboring points of the interpolated boundary. Neighboring points having a same test result value could be used to shift the boundary estimate to more accurately reflect the actual boundary. In certain aspects of the present invention, one or more parts of the boundary estimate are refined. This process is covered in more detail with reference to FIG. 1. In certain embodiments of the present invention, the final refinement stage is not used.

Referring now to FIG. 1, a flowchart is shown illustrating a boundary estimation technique 100, according to certain embodiments of the present invention. Suppose that a boundary of a Schmoo plot exists and needs to be estimated. Initially, one or more boundary points are discovered in a Schmoo plot (block 110). The remainder of the boundary can be discovered by tracing around the boundary as in block 120. The boundary estimate may then be interpolated to provide an accuracy within the acquisition resolution (block 130). The boundary estimate may be further refined by performing acquisitions around the points making up the boundary estimate (block 140).

Figure 2:
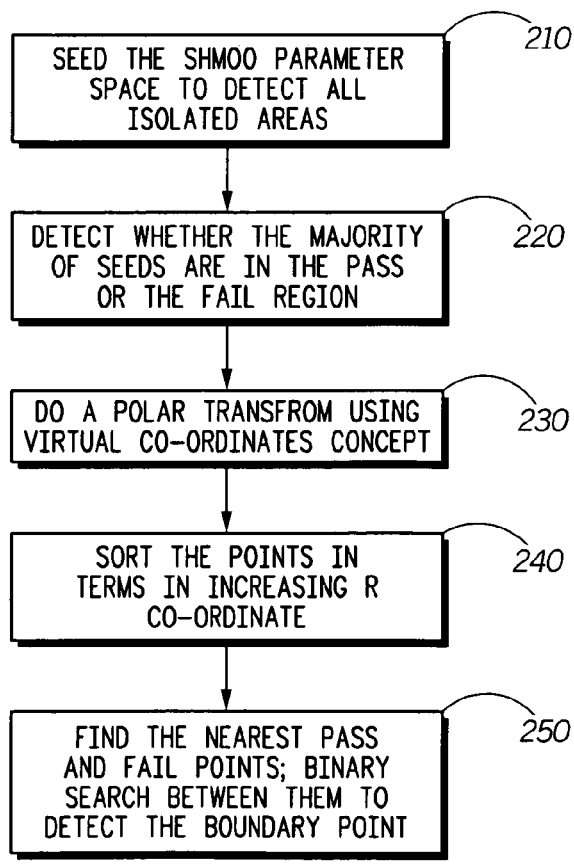
FIG. 2 is a flowchart illustrating seed point selection and sorting, according to certain embodiments.

Referring now to FIG. 2, a flowchart is shown illustrating seed point selection and sorting 200, according to certain embodiments of the present invention. A plurality of seed points are selected across the Schmoo parameter space (block 210). The plurality of seed points are selected so that regions of the Schmoo plot that exceed a specified size are tested for defects. In certain embodiments of the present invention, the plurality of seed points are uniformly distributed across the Schmoo plot. The seed points may be chosen to be ½ of the acquisition resolution, without departing from the spirit and scope of the present invention. The plurality of seed points are then evaluated to determine a minority grouping of the plurality of seed points (block 220). The minority grouping could reflect, for example, that the minority of seeds are in the pass region. A rectangular to polar transformation is then performed (block 230). The rectangular to polar transformation allows the plurality of seed points, and a one or more seed points comprising the minority grouping, to be sorted as a function of R, where R is a distance from an origin (block 240). The polar transform is used to get the 2 closest points one of which is pass domain and the other one is in the fail domain. If you sort the points with increasing "r" co-ordinate then the first point on the transition boundary of fail->pass could be picked up as a locally optimal solution to start the discovery of the boundary. In certain embodiments of the present invention, a fail point is selected as the starting seed point. The nearest boundary point is then discovered using a neighborhood search.

A divide and conquer algorithm, such as binary search, between the fail points in a subset and the pass points in the subset may then be used to estimate the boundary location (block 250). It is noted that certain embodiments of the present invention may use results comprising pass, fail and indeterminate results without departing from the spirit and scope of the present invention. In certain embodiments real-valued parameter results may be used, so that the minority grouping is selected to be a subset of the range of the real-valued parameter results.

Figure 3:
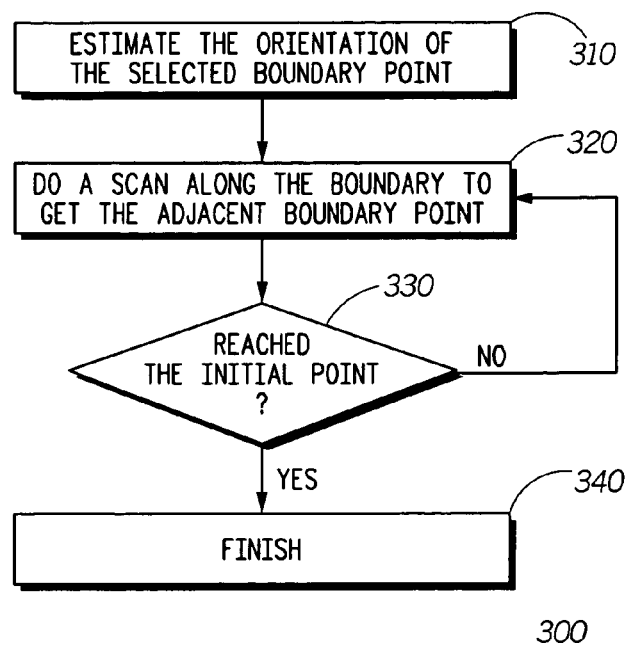
FIG. 3 is a flowchart illustrating a boundary scan algorithm, according to certain embodiments.

Referring now to FIG. 3, a flowchart is shown illustrating a boundary scan algorithm 300, according to certain embodiments of the present invention. An initial boundary point is oriented with respect to the origin of the Schmoo plot (block 310). A scan along the boundary is then performed (block 320). In certain embodiments, the scan is clockwise. The scan determines the adjacent point on the boundary to the selected boundary point. The scan process is repeated until an adjacent boundary point is found that is substantially close to the initial boundary point (block 330). In certain embodiments of the present invention, the scan process is complete when a most recent adjacent boundary point is the initial boundary point. At the completion of this scan process (block 340), the set of adjacent boundary points so discovered are then referred to as a coarse boundary estimate. The scan process may be performed by applying the rectangular to polar transformation and sorting the resulting points as a function of rho as in block 230 and block 240.

Figure 4:
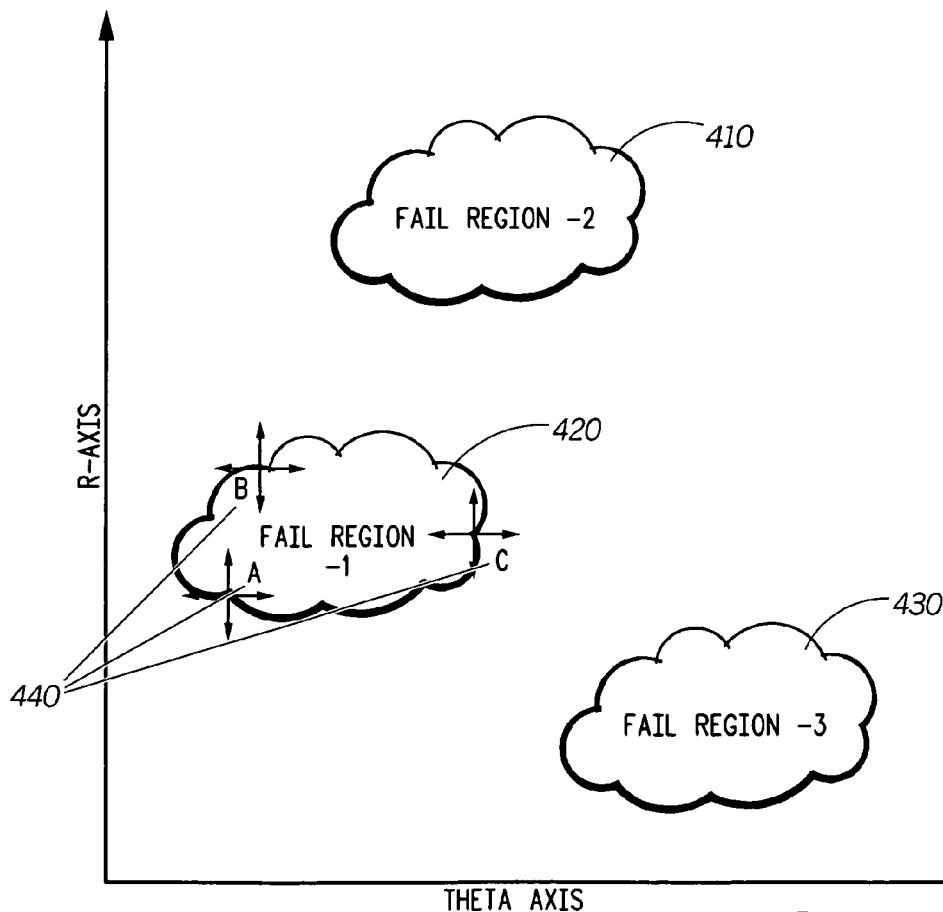
FIG. 4 is a flowchart illustrating an example of the boundaries in a Schmoo plot, according to certain embodiments.

Referring now to FIG. 4, a flowchart is shown illustrating an example of the boundaries in a Schmoo plot 400, according to certain embodiments of the present invention. Fail region 410, fail region 420, and fail region 430 are shown on a polar plot. Fail region 420 comprises boundary points A, B, and C (440). When an initial boundary point, A, is discovered four adjacent points at unit displacement are found and represented by arrows in the figure. Let us call these points L,R,U,D for left, right, up and down. If L passes and R fails then the adjacent point needs to be searched in the upper left quadrant. Similarly, for the point B, if U passes and D fails then the adjacent point is in the upper right quadrant. Thus, evaluation of these adjacent points is sufficient to indicate a direction of the adjacent boundary point. It is noted that in certain embodiments of the present invention, a different number of adjacent points may be used. For example, three adjacent points provide 120 degrees of uncertainty in the location of the adjacent boundary point.

Figure 5:
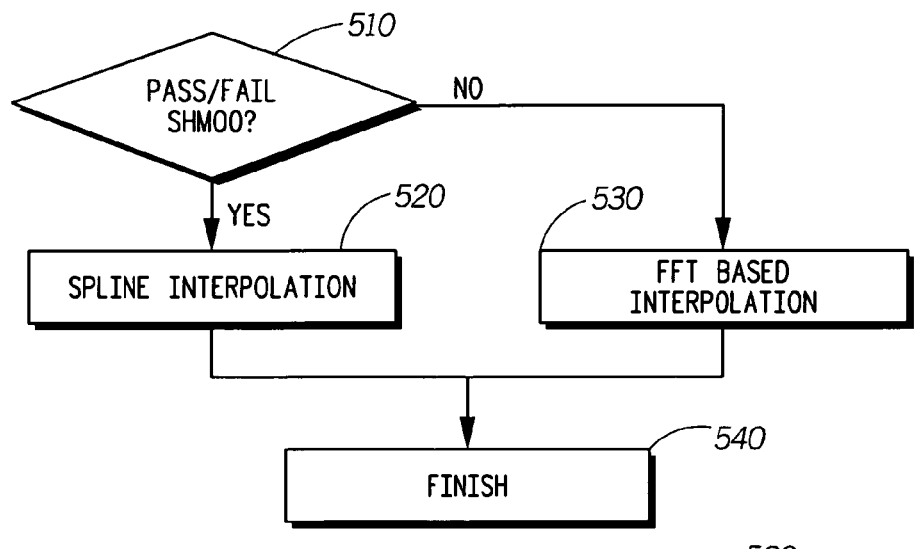
FIG. 5 is a flowchart illustrating interpolation selection, according to certain embodiments.

Referring now to FIG. 5, a flowchart is shown illustrating interpolation selection 500, according to certain embodiments of the present invention. If a Schmoo plot has only Pass or Fail as a test result (block 510), then spline interpolation is applied (block 520). If the Schmoo plot has more than two possible test outcomes, then FFT based interpolation is applied (block 530). FFT or spline based interpolation is then applied to the coarse boundary estimate (block 540). In certain embodiments of the present invention, spline-based interpolation is applied when the test results are binary valued, and FFT-based interpolation is applied when the test results are trinary-valued. The spline-based interpolation may be a cubic spline. In addition to interpolation, the boundary estimate may be further refined by testing additional points that are adjacent to the refined boundary estimate. The boundary estimate may then be shifted in accordance with the results of testing these adjacent points.

Figure 6:
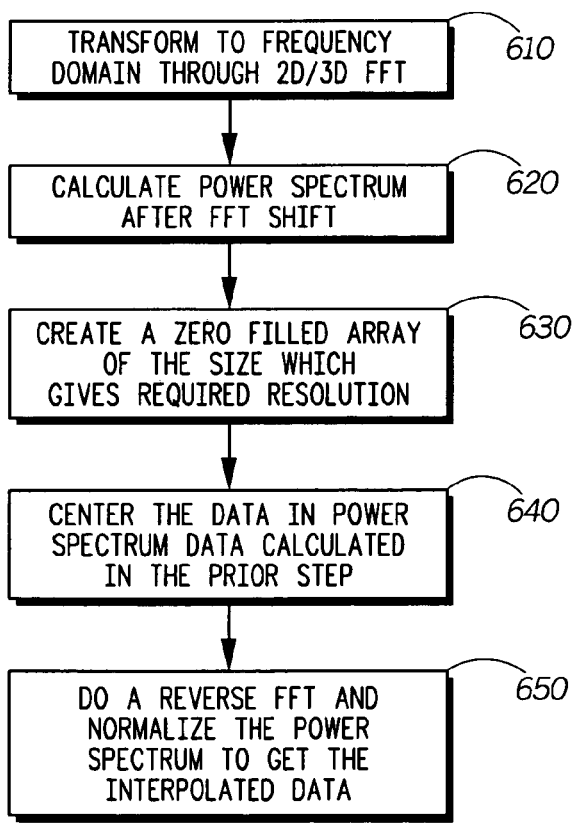
FIG. 6 is a flowchart illustrating FFT-based interpolation, according to certain embodiments.

Referring now to FIG. 6, a flowchart is shown illustrating FFT-based interpolation 600, according to certain embodiments of the present invention. A Fast Fourier Transform (FFT) is applied to a coarse boundary estimate (block 610). The power spectrum is then computed using the results of the FFT computation (block 620). In certain embodiments, the power spectrum is computed by windowing the coarse boundary estimate, computing the FFT, and normalizing the FFT result. In certain embodiments of the present invention, the window is one of a Hamming, Hanning, Blackman, Bartlett, and rectangular window. A zero filled array is then created which has entries spaced by the inverse of the acquisition resolution (block 630). The power spectrum data is then centered on the array, with the DC bin of the power spectrum located at the array center (block 640). An inverse FFT is then computed, and the real part of the resulting points are normalized to provide the interpolated data (block 650).

Figure 7:
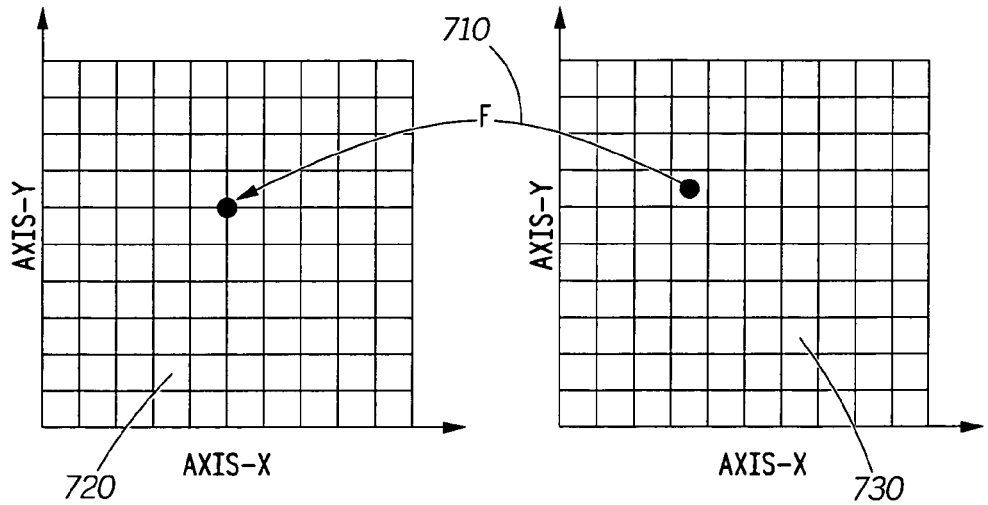
FIG. 7 is a flowchart illustrating a Cartesian to Polar coordinate transformation, according to certain embodiments.

Referring now to FIG. 7, a flowchart is shown illustrating a Cartesian to Polar coordinate transformation 700, according to certain embodiments of the present invention. A point (x, y)

in Cartesian coordinates 730 is mapped to polar coordinates 720 (rho, theta) by the transformation F 700. The transformation equations are:

Polar to Cartesian:

$$f(r, \theta) \rightarrow f(x,y)$$

where, $x = r.\cos\theta$, $y = r.\sin\theta$

Cartesian to Polar:

$$F(x,y) \rightarrow f(r, \theta)$$

$$r = (x^2 + y^2)^{0.5}$$

$$\theta = \tan^{-1}(y/x)$$

Consider the transformation 700 from the Cartesian plane to the Polar plane:

$$P'_{l,m} \xleftarrow{F} P_{i',j'}.$$

Where, l,m are integral values, while i',j' are such that $$i \in [i, i+1] j \in [j, j+1]$$

Then, a virtual pixel $P_{i',j'}$ would be constructed using the 4 neighboring pixels to get the integral pixel in the Log-polar plane. For all the integral values of l,m in the Polar plane, corresponding virtual pixels would have to be constructed in the Cartesian plane. As mentioned previously, the rectangular to polar transformation allows the test points to be sorted in increasing distance from the origin. The first point in a boundary discovery process may then be determined by examining points closest to the origin for a change in test result value.

Figure 8:
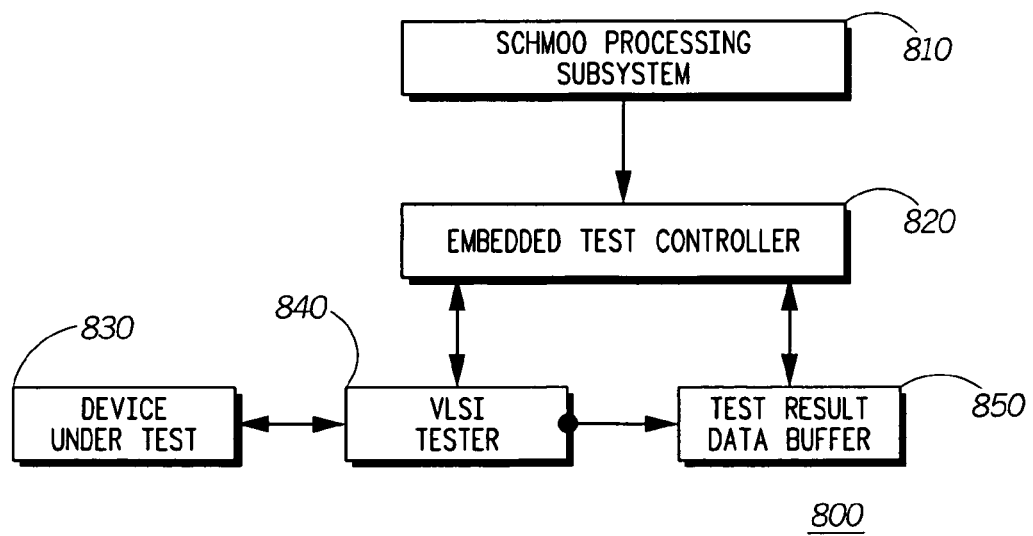
FIG. 8 is a block diagram of a Schmoo system, according to certain embodiments.

Referring now to FIG. 8, a Schmoo system 800, including a Schmoo subsystem 810 described at length above, operates as follows in accordance with certain embodiments of the invention. The system sets up an embedded test controller 820 to drive or control a tester, such as VLSI tester 840, within the given range of parameters that need to be analyzed for the DUT 830. The embedded test controller 820 drives or controls the VLSI tester 840 to drive the DUT 830 and store the pass/fail or like test result data in a storage element or buffer, such as a pass/fail data buffer as shown in block 850. The embedded test controller 820 then retrieves the test result data from the data buffer and passes it back to the Schmoo processing subsystem 810 for analysis and display, as described at length above with regard to FIGS. 1-7. The Schmoo processing subsystem 810 may include a so-called dumb controller that passes the user assigned ranges and granularity to the embedded test controller 820 which in turn drives the tester and gathers the test result data to be sent back to the Schmoo processing subsystem 810. The Schmoo processing subsystem 810 displays the test result data appropriately.

The Schmoo processing subsystem 810 has the required intelligence via processing capabilities to control this whole process. It takes the user inputs and decides on the granularity of acquisition that gets passed to the embedded test controller 820. Once the test result data is passed back to it, a suitable interpolation technique as managed by a processor, such as an interpolation processor, of the Schmoo processing subsystem is used to reconstruct the result for the user. In certain embodiments, in the process of the refinement additional input from the user is taken to verify the interpolated results and to refine them only in the regions of interest. For most Schmoo plots, this will cut down the acquisition time from anywhere ½-1/16.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for generating a boundary of a Schmoo plot, comprising:
   selecting a plurality of seed points having a seed resolution that is less than or equal to ½ of an acquisition resolution indicated by a smoothness of a representative Schmoo boundary;
   performing a coarse boundary search to identify a plurality of the seed points that are within the acquisition resolution of the boundary;
   an interpolation processor interpolating a set of the seed points that comprise the coarse boundary to produce a fine estimate of the boundary.

2. The method of claim 1, wherein selecting the plurality of seed points further comprises grouping the plurality of seed points in accordance with the corresponding plurality of test results, so that one or more of the plurality of seed points having a substantially similar test result are grouped together.

3. The method of claim 1, wherein performing the coarse boundary search further comprises:
   for a first seed point of a plurality of seed points in a group, testing one or more neighbors that are within acquisition resolution of the first seed point until a neighbor is tested that has a test result substantially similar to the test result of the first seed point;
   repeating the neighbor testing using each successive neighbor having a substantially similar test result as a starting point; and
   stopping the coarse boundary search when the most recently found similar neighbor is within the acquisition resolution of the first seed point so that the coarse boundary is defined by a set of neighbor points having test results substantially similar to the first seed point.

4. The method of claim 1, wherein the interpolating the seed points further comprises performing one of:
   populating an array, where an element of the array is zero unless it is a seed point in the coarse boundary or a neighbor of a seed point in the course boundary, applying a window function to the array, taking an FFT of the array, extending the FFT of the array by zero-padding, and taking the inverse FFT of the extended array to produce array values that are spaced no more than the acquisition resolution; and
   performing a spline-based interpolation comprising fitting an N−1 order curve to N adjacent boundary points at the acquisition resolution.

5. A method for reducing the computational complexity of a Schmoo plot, comprising:
   testing in a seed stage a plurality of seed points with the plurality of seed points having a seed resolution less than an acquisition resolution of the DUT and the plurality of seed points are grouped according to a plurality of corresponding test results;
   performing a coarse boundary search, comprising:
     for a first seed point of a plurality of seed points in a group, testing one or more neighbors that are within acquisition resolution of the first seed point until a neighbor is tested that has a test result substantially similar to the test result of the first seed point;
     repeating the neighbor testing using each successive neighbor having a substantially similar test result as a starting point;

stopping the coarse boundary search when the most recently found similar neighbor is the acquisition resolution of the first seed point so that a coarse boundary is defined by a set of neighbor points having test results substantially similar to the first seed point; and an interpolation processor interpolating the seed points that comprise the coarse boundary to produce a fine boundary estimate.

6. The method of claim 5, wherein neighbors of the seed points that comprise the coarse boundary are also interpolated.

7. The method of claim 5, wherein the test seed resolution is one of 1/8 and 1/16 of the acquisition resolution.

8. The method of claim 5, wherein the fine boundary estimate is further refined by testing neighboring test points of the fine boundary estimate, so that the fine boundary estimate is shifted in accordance with the results of testing the neighboring test points.

9. The method of claim 5, wherein a first acquisition resolution of a first dimension is not the same as a second acquisition resolution of a second dimension, said first dimension corresponding to a first parameter to be evaluated and said second dimension corresponding to a second parameter to be evaluated.

10. The method of claim 5, wherein the test result values are one of PASS, FAIL, and indeterminate.

11. The method of claim 5, wherein the neighbor testing is performed in a clockwise direction.

12. The method of claim 5, wherein the seed stage further comprises:
   reducing the seed resolution below the acquisition resolution;
   computing reduced resolution test results;
   selecting a boundary region;
   assigning each seed point as a starting point for boundary discovery; and
   for each seed point, performing a search between the seed point and the nearest boundary using acquisition resolution.

13. The method of claim 12, wherein the search is a divide and conquer search.

14. The method of claim 5, wherein the coarse boundary contains the least seed points having a certain value.

15. The method of claim 5, wherein the seed points resolution is 1/2 of the acquisition resolution.

16. The method of claim 5, wherein the first seed point is determined by:
   performing a rectangular to polar transformation;
   sorting by distance from an origin; and
   assigning the first seed point as a point closest to the origin wherein a neighboring point that is closer to the origin has a different value.

17. The method of claim 5, wherein the interpolation is FFT-based, further comprising:
   creating an array, where an element of the array is zero unless it is a seed point in the coarse boundary or a neighbor of a seed point in the course boundary;
   applying a window function to the array; taking an FFT of the array; extending the FFT of the array by zero-padding; and
   taking the inverse FFT of the extended array to produce array values that are spaced no more than the acquisition resolution.

18. The method of claim 17, wherein an array value of a neighbor of a boundary test point has a zero value.

19. The method of claim 17, wherein the test result values are one of PASS, FAIL, and indeterminate.

20. The method of claim 17, wherein the array is three-dimensional.

21. The method of claim 17, wherein the FFT of the array is normalized.

22. The method of claim 17, wherein the array is extended by the reciprocal of the acquisition resolution.

23. The method of claim 17, wherein the boundary of the Schmoo plot is given by the normalized real part of the inverse FFT result.

24. The method of claim 5, wherein the interpolation is spline-based.

25. The method of claim 24, wherein the spline-based interpolation further comprising fitting an N−1 order curve to N adjacent boundary points at the acquisition resolution.

26. The method of claim 1, wherein the smoothness of the representative Schmoo boundary is determined from empirical data.

27. A system operable to generate a boundary of a Schmoo plot, comprising:
   a tester of a device under test (DUT) operable to test the device under test and store test results in a storage element;
   a test controller operable to drive the tester and to retrieve stored test results from the storage element; and
   a Schmoo processing subsystem operable to receive test results retrieved from the storage element by the test controller and analyze the test results to generate the boundary of the Schmoo plot.

28. The system of claim 27, wherein the Schmoo processing subsystem is operable to:
   select a plurality of seed points having a seed resolution that is less than or equal to 1/2 of an acquisition resolution indicated by a smoothness of a representative Schmoo boundary;
   perform a coarse boundary search to identify a plurality of the seed points that are within the acquisition resolution of the boundary; and
   interpolate the seed points that comprise the coarse boundary to produce a fine estimate of the boundary.

29. The system of claim 27, wherein the Schmoo processing subsystem is further operable to display the boundary of the Schmoo plot to a user of the system.

30. The system of claim 27, wherein the Schmoo processing subsystem is further operable to communicate the interpolated seed points to a user of the system.

31. A system operable to reduce the computational complexity of a Schmoo plot, comprising:
   a tester of a device under test (DUT) operable to test the device under test and store test results in a storage element;
   a test controller operable to driver the tester and to retrieve stored test results from the storage element; and
   a Schmoo processing subsystem operable to receive test results retrieved from the storage element by the test controller and analyze the test results to reduce the computational complexity of the Schmoo plot.

32. The system of claim 31, wherein the Schmoo processing subsystem is operable to:
   test in a seed stage a plurality of seed points with the plurality of seed points having a seed resolution less than an acquisition resolution of the DUT, wherein the plurality of seed points are grouped according to a plurality of corresponding test results;

perform a coarse boundary search, comprising:
    for a first seed point of a plurality of seed points in a group, test one or more neighbors that are within acquisition resolution of the first seed point until a neighbor is tested that has a test result substantially similar to the test result of the first seed point;
    repeat the neighbor testing using each successive neighbor having a substantially similar test result as a starting point;
    stop the coarse boundary search when the most recently found similar neighbor is within the acquisition resolution of the first seed point so that a coarse boundary is defined by a set of neighbor points having test results substantially similar to the first seed point; and
    interpolate the seed points that comprise the coarse boundary to produce a fine boundary estimate.

* * * * *

UNITED STATES PATENT AND TRADEMARK OFFICE
CERTIFICATE OF CORRECTION

PATENT NO. : 7,711,524 B2  Page 1 of 1
APPLICATION NO. : 11/311025
DATED : May 4, 2010
INVENTOR(S) : Lokesh Johri et al.

It is certified that error appears in the above-identified patent and that said Letters Patent is hereby corrected as shown below:

In the Detailed Description, Column 7, Line 2, "similar neighbor is the" should read --similar neighbor is within the--.

Signed and Sealed this

Third Day of August, 2010

David J. Kappos
*Director of the United States Patent and Trademark Office*